(12) United States Patent
Kendall

(10) Patent No.: US 6,925,558 B2
(45) Date of Patent: Aug. 2, 2005

(54) SYSTEM AND METHOD FOR SELECTING AND LOADING CONFIGURATION DATA INTO A REGISTER THROUGH THE USE OF A FIRST AND SECOND RESET SIGNAL

(75) Inventor: Terry L. Kendall, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 681 days.

(21) Appl. No.: 09/821,556

(22) Filed: Mar. 29, 2001

(65) Prior Publication Data

US 2002/0144103 A1 Oct. 3, 2002

(51) Int. Cl.$^7$ ................................................. G06F 1/24
(52) U.S. Cl. ............................... 713/100; 713/1; 713/2
(58) Field of Search .............................. 713/1, 2, 100; 710/14

(56) References Cited

U.S. PATENT DOCUMENTS

| | | | | |
|---|---|---|---|---|
| 5,822,581 A | * | 10/1998 | Christeson | 713/1 |
| 5,852,561 A | * | 12/1998 | Chan et al. | 716/17 |
| 6,038,689 A | * | 3/2000 | Schmidt et al. | 714/48 |
| 6,606,670 B1 | * | 8/2003 | Stoneking et al. | 710/14 |
| 6,647,512 B1 | * | 11/2003 | James et al. | 714/36 |

FOREIGN PATENT DOCUMENTS

| | | | | |
|---|---|---|---|---|
| JP | 2002014818 A | * | 1/2002 | G06F/9/445 |

OTHER PUBLICATIONS

BE6 Motherboard User's Manual, Rev. 1.01, pp. 3-1-3-38.*

* cited by examiner

Primary Examiner—Thomas Lee
Assistant Examiner—Mark Connolly
(74) Attorney, Agent, or Firm—Blakely, Sokoloff, Taylor & Zafman LLP

(57) ABSTRACT

A default configuration for a memory is placed in a non-volatile register, while an input logic circuit can provide at least one alternate programmable configuration. A selection circuit can select between the default configuration and the programmable configuration. The selected configuration can be placed into a register that provides active configuration data that is used to determine the actual memory configuration. Upon a reset condition, a reset configuration bit can be used to determine whether the memory will be reset with the default configuration or the active configuration that was being used before the reset.

42 Claims, 4 Drawing Sheets

SYSTEM AND METHOD FOR SELECTING AND LOADING CONFIGURATION DATA INTO A REGISTER THROUGH THE USE OF A FIRST AND SECOND RESET SIGNAL

BACKGROUND OF THE INVENTION

1. Field of the Invention

The invention pertains generally to computers. In particular, it pertains to computer memory.

2. Description of the Related Art

Flash memory is commonly used for applications that require a non-volatile memory to store code and data that must be retained when power to the memory is removed, but which can be re-written when necessary during operation. Flash memory is favored because it can be written and erased while in-circuit, and because it has read access times comparable to static random access memory (SRAM). Its primary disadvantage is that it can only be erased in blocks, with a block typically being several thousand bytes, and the erase function can take a relatively long time to accomplish. This makes minor changes to the memory contents somewhat cumbersome to perform.

Generic flash memory can be manufactured and then provided to multiple equipment makers who place the flash memory into various products that have differing memory configuration requirements. Some of these configuration requirements deal with the way memory is partitioned, such as by providing predefined protected blocks that cannot be rewritten without having special access privileges. Other requirements may deal with the polarity of certain memory interface signals, such as whether address lines are to be sampled on a rising or falling edge of a clock. Certain memory addresses may be reserved for specific functions external to memory. These and/or other configuration data are typically placed into non-volatile locations during the manufacturing or assembly stages, where they effectively become permanent. When the product is placed into operation, this configuration information is retrieved and loaded each time the system is rebooted or otherwise reset. However, if the configuration data is programmed during memory manufacture, a different configuration must be manufactured for each customer and each product. If it is programmed during assembly of that product by the customer, the customer must acquire, operate, and maintain the equipment for this one-time programming operation. Further, changes in the product that require changes in the configuration may require the customer to physically replace and discard the existing memories in existing products, a field upgrade procedure that can be extremely expensive.

Some product makers may wish to design their product so that the configuration can be temporarily changed for some specific function, thus requiring the configuration to be reprogrammable while in-circuit, a feat that is not feasible in a conventional system with the configuration in permanent memory.

A conventional alternative to this permanently-programmed configuration is to place the configuration data in a volatile register, which requires the register to be reloaded every time the power turned on. This adds to the system start-up overhead, which should be minimized in many products. This approach also requires the configuration data to be placed into some other non-volatile but programmable location when the power is off so that it will be available to be reloaded when power is turned on.

The inherent limitations in these two configuration methods can force the manufacturers to choose between two imperfect approaches, and accept the disadvantages of the choice they make.

DETAILED DESCRIPTION OF THE INVENTION

Various embodiments of the invention permit a memory, such as a flash memory, to have capabilities for active configuration data that is selectable between default configuration data and programmable configuration data. Various embodiments of the invention can have reset capability that can reset the memory with either the default configuration data or the active configuration data that was being used immediately before the reset condition occurred.

Default configuration data can be defined as predetermined intended operational configuration data, i.e., the configuration data that is intended to be used unless it is overridden by different configuration data.

Programmable configuration data can be defined as configuration data that can be programmed into the memory device during operation, and which can override the default configuration data. Programmable configuration data can be used to accommodate a special or temporary configuration requirement during operation of the system. Programmable configuration data can also be used by a manufacturer who buys a memory device that has a particular default configuration data, and inserts that memory device into a product that requires a different memory configuration.

Active configuration data can be the configuration data that is to actually be used, whether or not it is the same as the default configuration data. Active configuration data can be made available to configuration logic that defines how the memory is actually configured. However, in some embodiments, this active configuration data may not be actually implemented to configure the memory until the occurrence of an event, such as the initiation of a reconfiguration sequence in the software.

Figure 1:
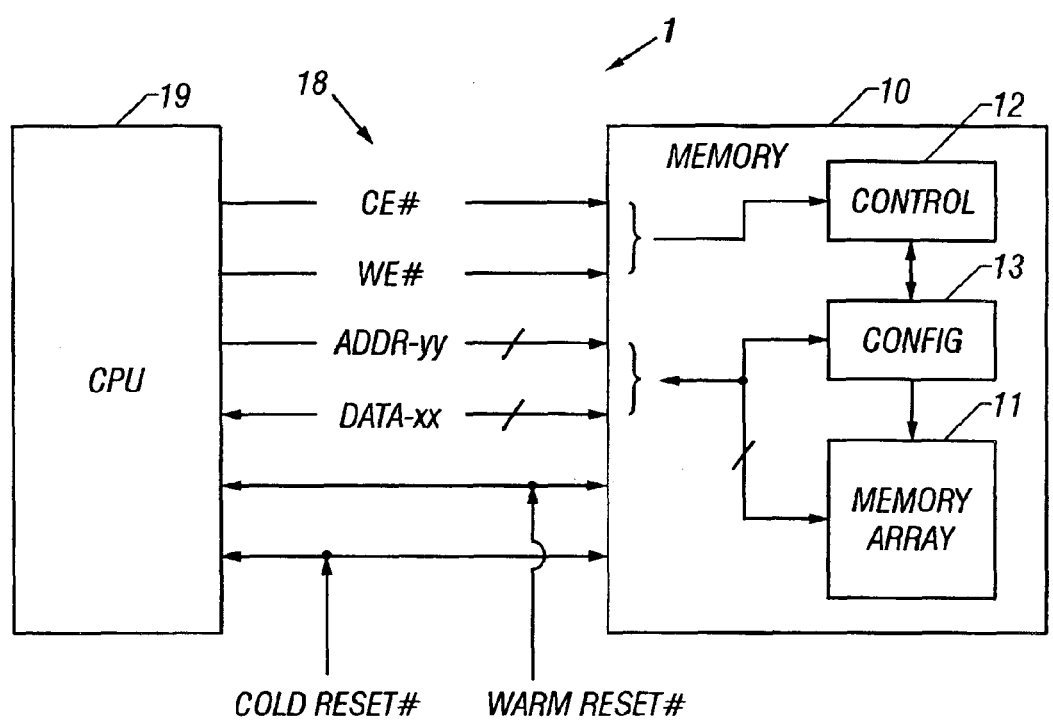
FIG. 1 shows a system embodiment.

FIG. 1 shows a system 1 with a memory 10 coupled to a processor (CPU) 19 by a bus 18. In one embodiment, memory 10 can comprise an integrated circuit, but in alternate embodiments memory 10 can be made up of multiple integrated circuits or a portion of a single integrated circuit, depending on the specific physical construction of memory 10. Memory 10 can include memory array 11 to store data, configuration circuit 13 to store configuration information, and control circuit 12 to control the operation of configuration circuit 13. Memory 10 may be part of a larger memory system that may include other types of memory (not shown).

Memory 10 can be coupled to CPU 19 via a memory bus 18. In one embodiment, bus 18 can include multiple data lines DATA-xx, multiple address lines ADDR-yy, chip enable line CE#, write enable line WE#, cold reset line COLD RESET#, and warm reset line WARM RESET#. COLD RESET# can be activated when the system is powered up, while WARM RESET# can be activated when the system is restarted but is already powered up. The cold and warm reset functions can also be activated under other circumstances, as is known to those of skill in the art.

DATA-xx can be comprised of multiple bi-directional data lines to carry data that is being read from memory array 11 and data that is being written into memory array 11. The DATA-xx lines can also be used to write/read configuration information to/from configuration circuit 13. Address lines ADDR-yy can be used to specify the address in memory array 11 at which the data on lines DATA-xx is being written to or read from. One or more addresses may be reserved to specify configuration circuit 13 so that data can be communicated to/from configuration circuit 13 over bus 18 much as it would to/from a location in memory array 11. Chip enable line CE# can carry a signal that selects memory 10 for read or write operations. In one embodiment, asserting the chip enable signal causes a power-up of memory 10, which otherwise remains in a low-power state. Asserting a signal on write enable line WE# can indicate that a write operation is taking place. In one embodiment, the data on data lines DATA-xx can be latched into memory 10 on the low-to-high transition of WE#.

Signals on the lines COLD RESET# and WARM RESET# can be asserted to indicate a cold reset and warm reset condition, respectively. In one embodiment, a cold reset indicates the system is to restart from a powered-off state, while a warm reset indicates the system is being restarted from a powered-on state. A warm reset typically causes a warm boot operation, in which some of the configuration or state data in CPU 19 is assumed to be correct and is not reloaded. A cold reset typically causes a cold boot operation, in which all volatile configuration or state data is reloaded into CPU 19 from scratch. A cold boot typically occurs upon power-up of the system. In some embodiments, there are more than two restart conditions. Each of these can be associated with one of the two reset signals of FIG. 1. Alternately, more than two reset signals (not shown) can be sent to CPU 19 and/or memory 10 to represent the various restart conditions.

Figure 2:
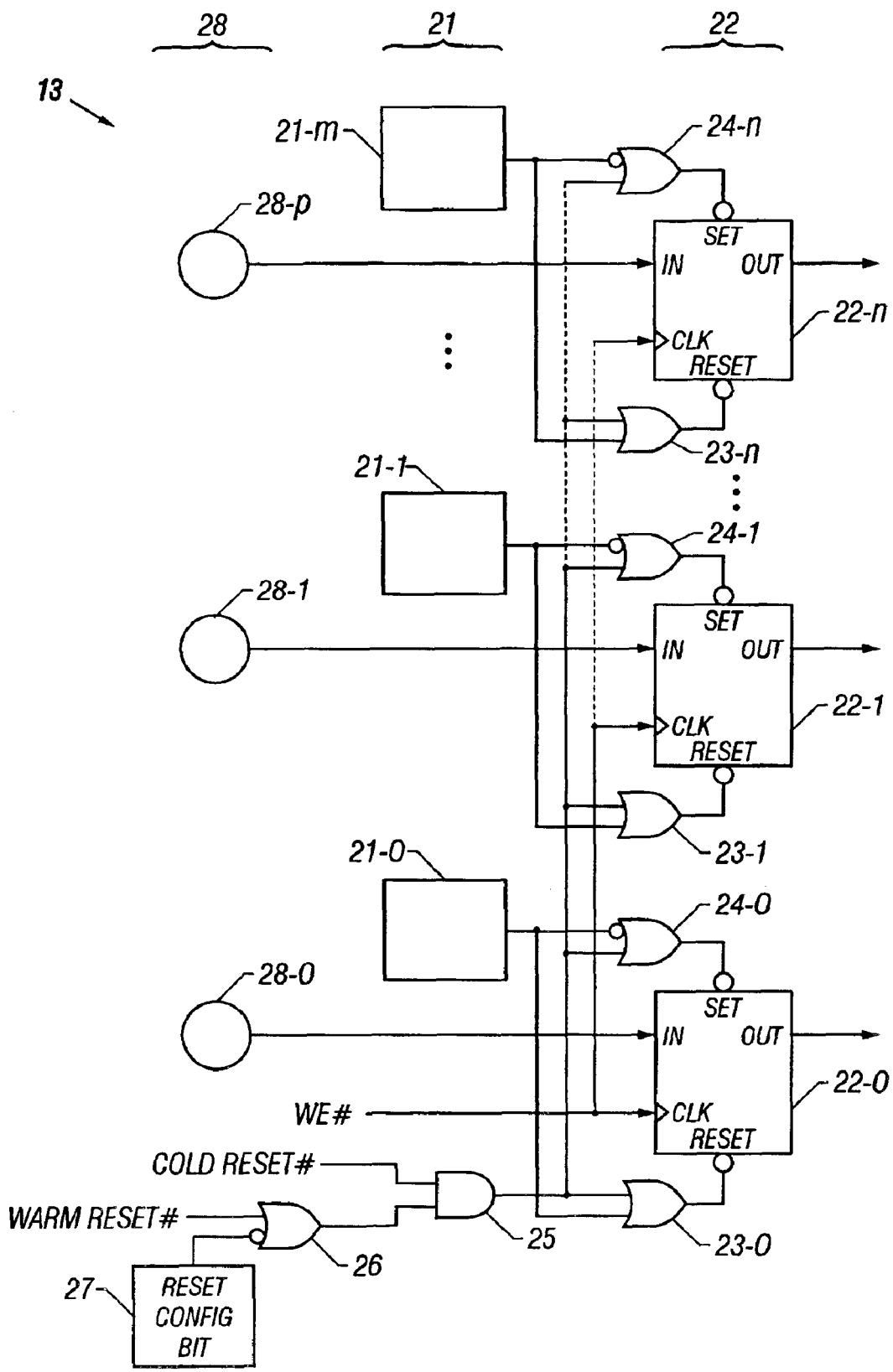
FIG. 2 shows a configuration circuit.

FIG. 2 shows a more detailed view of one embodiment of circuit 13 for receiving, storing, and providing configuration data. Latches 21-0 through 21-m can collectively form a non-volatile register to store default configuration data, with each latch storing one bit of the default configuration data. The number of latches may depend on the amount of configuration data needed. This is shown by designating the last configuration bit as "m". These latches can be referred to generically as 21-x, with the "x" representing any or all of the bit positions 0 through m. Because latches 21-x are non-volatile, they can hold their data even when power is removed from circuit 13. In one embodiment, latches 21-x can be hardwired into circuit 13 when circuit 13 is manufactured. In another embodiment, latches 21-x can be comprised of one-time programmable read-only memory, which can be programmed with default configuration data at a suitable point in the manufacturing/assembly/distribution process. In another embodiment, latches 21-x can be comprised of reprogrammable non-volatile memory, such as flash memory. These different types of non-volatile storage can also be combined in register 21 by using different types in different latches.

Default configuration data can be the configuration data that is predicted to be the most likely needed set of configuration data for the intended application(s) of the associated memory 10. This most-likely-needed designation might be based on a number of things, including but not limited to:
1) the intended product(s) in which memory 10 is to be used,
2) the particular version of those product(s),
3) the application software to be used in the product in which memory 10 is to be used,
4) the particular version of that software, or
5) anticipated needs of the end user.

Latches 22-0 through 22-n can collectively form a volatile register that can store active configuration data. Active configuration data can be the configuration data that is being used in memory 10, or that is to be used shortly. The number of latches in the volatile register may depend on the amount of configuration data needed. This is shown by designating the last configuration bit as "n". The latches of this volatile register can be referred to generically as latches 22-x, where x can be any of the bit positions 0 through n. Latches 22-x can be programmed by loading data into them from other sources such as non-volatile latches 21-x or from an alternate source.

In FIG. 2, the alternate source is indicated by input logic 28 that includes individual input bits 28-0 through 28-p, where p is the number of bit positions represented. These can be referred to generically as input bits 28-x. In one embodiment, input bits 28-x can convey programmable configuration data provided over bus 18 by processor 19 when it dynamically loads volatile latches 22-x. This can permit the processor to determine which configuration data is to be used, and dynamically place it into volatile latches 22-x where it can be used to define the configuration of memory 10. In another embodiment, the programmable input data of input logic 28-x can be provided from data stored in other registers or memory locations (not shown). In this manner, one or more alternate configurations can be pre-determined and placed into storage for immediate use by circuit 13 without requiring the software of CPU 19 to determine exactly what the alternate configuration should be.

In one embodiment, non-volatile register 21, volatile register 22, and input logic 28 can each have the same number of bits, as is implied by the circuit of FIG. 2. In other embodiments, they may have a different number of bits, as is implied by the use of different designators "m", "n", and "p". There can be several reasons for this, which include but are not limited to:
1) The default configuration may be more (or less) limited than the programmable configuration in the scope of the configuration it defines, thereby requiring fewer (or more) bits.
2) It may be desirable to keep some configuration bits the same for both the default and the programmable configurations, thus requiring fewer input bits 28-x.

The programmable configuration data from input logic 28 can be written into latches 22-x with signal WE#, or the equivalent of this signal. In the illustrated embodiment, WE# can be the buffered write enable from bus 18, with the low-to-high transition of WE# causing each latch 22-x to clock in the data appearing at the data input of the latch, which can be the data appearing on data lines DATA-xx of FIG. 1. In this manner, the data from input logic 28 can replace whatever configuration data had previously been placed in register 22.

When the system experiences a cold reset condition, signal COLD RESET# can be asserted. In one embodiment, the cold reset condition can be a power-up condition, and the COLD RESET# signal can be a power-up reset signal. The affect of this on circuit 13 can be illustrated by describing its affect on latch 22-0. By common convention, the '#' in the signal name COLD RESET# indicates that it is asserted by bringing its signal voltage low. This will cause the output of AND gate 25, and therefore the connected inputs of OR gates 23-0 through 23n (23-x) and 24-0 through 24-n (24-x), to become low. This in turn permits the output of non-volatile latches 21-0 through 21-m (21-x) to control the Set and Reset inputs of corresponding volatile latches 22-x. A logic '1' in any latch 21-x will cause corresponding latch 22-x to be set, making its output a logic 1. A logic '0' in any latch 21-x will cause corresponding latch 22-x to be reset, making its output a logic 0. A COLD RESET# signal can therefore load the contents of non-volatile register 21 into volatile register 22, making the default configuration the active, or operational, configuration.

When the system is restarted from a previously powered-up state, or otherwise experiences a warm reset, additional logic can be employed. If a WARM RESET# signal is asserted by bringing the signal low, that permits the state of Reset Config Bit 27 to control whether the warm reset signal is propagated to the other input of AND gate 25. If the output of Reset Config Bit is high when WARM RESET# is low, the output of OR gate 26 and the connected inputs of AND gate 25 will be low. This makes the output of AND gate 25 low, and forces the contents of non-volatile register 21 to be loaded into volatile register 22 in a similar manner to that described in the previous paragraph. If the output of Reset Config Bit is low, the output of OR gate 26 and the connected input of AND gate 25 will both be high. Except for a cold reset, this condition makes the outputs of AND gate 25, OR gates 23-0 through 23-n (23-x), and OR gate 24-0 through 24-n (24-x) all high, effectively disabling the Set and Reset inputs of latches 22-0 through 22-n (22-x). In this condition, the contents of latches 22-x remain unchanged even though a warm reset is being performed on the system. This effectively permits the system to be rebooted with the same memory configuration that it had before the warm reset was initiated.

Thus, the state of the Reset Config Bit 27 can determine whether a warm reset will reload the active configuration register 22 with the default configuration data, or leave the previous configuration data in register 22 unchanged. In one embodiment, reset configuration bit 27 can be programmed by CPU 19 in any manner known to those of skill in the art.

Figure 3:
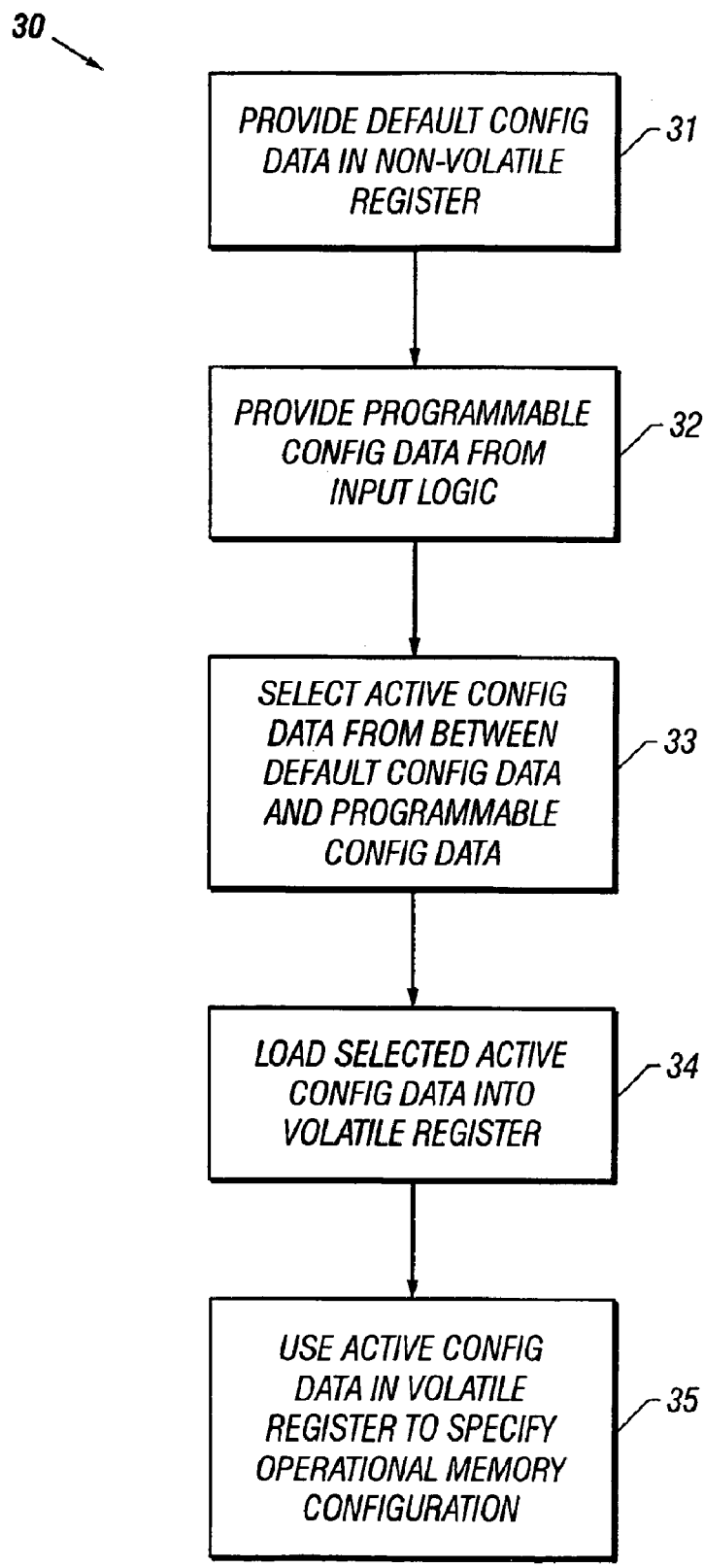
FIG. 3 shows a method of loading active configuration data.

FIG. 3 shows a flow chart 30 of a method embodiment. Block 31 provides default configuration data in a non-volatile register, i.e., a register that does not lose its contents when electrical power is removed from the register. In various embodiments, the non-volatile register can be formed of permanent latches, one-time programmable latches, or reprogrammable latches such as flash memory. Block 32 provides programmable configuration data from an input logic circuit. In one embodiment, the input logic circuit can provide data obtained from the data lines of a memory bus. At block 33, active configuration data is selected from either the default configuration data in the non-volatile register or the programmable configuration data provided by the input logic circuit. At block 34, the selected active configuration data is loaded into an active configuration register, which can be a volatile register. At block 35, the active configuration data in the active configuration register is used to specify an operational memory configuration. In one embodiment, this active configuration may be implemented immediately to configure the associated memory. In another embodiment, this active configuration may be implemented upon the occurrence of a predetermined event, such as the initiation of a memory reconfiguration request by the software.

Figure 4:
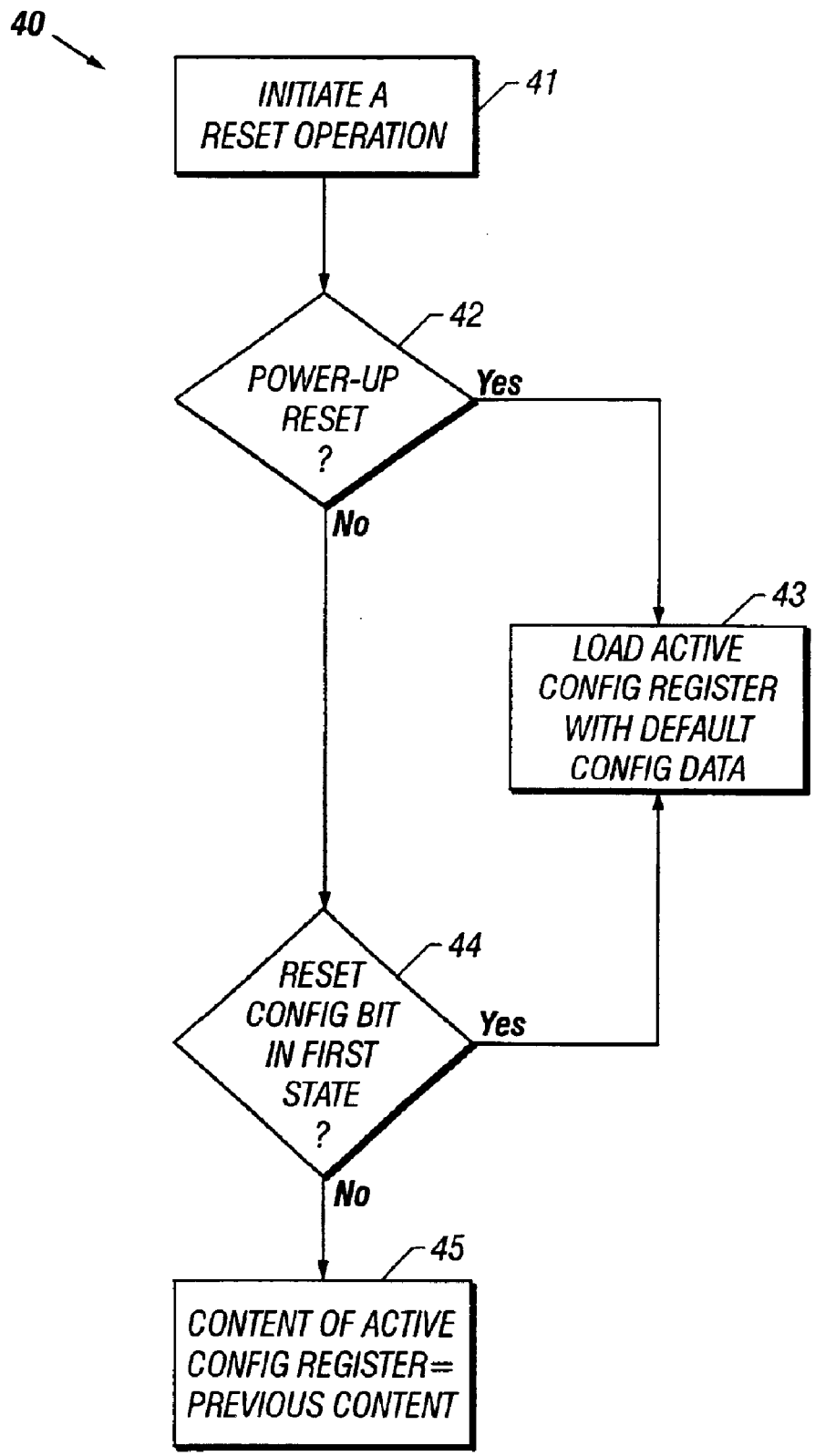
FIG. 4 shows a method of resetting configuration data.

FIG. 4 shows a flow chart 40 of a method embodiment involving a reset operation. At block 41, a reset operation is initiated in the system. At block 42, it is determined whether or not this is a power-up reset. If it is, at block 43 the active configuration register is loaded with default configuration data from the default configuration register. If it is not, a reset configuration bit is examined at block 44. In one embodiment, this reset configuration bit can be previously programmed to the desired state. To avoid obscuring the invention, the process for programming a configuration bit is not described, but can be implemented in various known ways by a person of ordinary skill in the art. If the reset configuration bit is in a first state (for example, a logic '1'), the active configuration register can be loaded with default configuration data from a default configuration register at block 43. If the reset configuration bit is not in the first state (for example, it is a logic '0'), the contents of the active configuration register can be left intact at block 45, i.e., the register's contents can remain equal to its previous contents.

The foregoing description is intended to be illustrative and not limiting. Variations will occur to those of skill in the art. Those variations are intended to be included in the invention, which is limited only by the spirit and scope of the appended claims.

I claim:

1. An apparatus, comprising:
   a first register to store default configuration data;
   a second register coupled to the first register to store active configuration data;
   an input circuit coupled to the second register to receive input data different than the default configuration data to be programmed into the second register;
   control logic coupled to the first register, the second register, and the input circuit to load the second register with data selected from either the default configuration data from the first register or input data from the input circuit; and
   reset logic coupled to the first register and the second register to select between loading the second register with the default configuration data and retaining a previous content of the second resister in the second register, the reset logic including
   a first reset line to carry a first reset signal to load default data from the first register into the second register,
   a second reset line coupled to the programmable selection circuit to carry a second reset signal, and
   a programmable selection circuit to store a selection value to determine if the second reset signal causes the second register to be loaded with the default configuration data from the first register or causes the second resister to retain its data.

2. The apparatus of claim 1, wherein the first reset line is a power-up reset line.

3. The apparatus of claim 1, wherein the second reset line is a warm-start reset line.

4. The apparatus of claim 1, wherein the input circuit is to receive write data from a data bus, the write data comprising programmable configuration data.

5. The apparatus of claim 1, wherein the first register is a non-volatile register.

6. The apparatus of claim 1, wherein the second register is a volatile register.

7. The apparatus of claim 1, wherein the default configuration data defines a first memory configuration and the programmable configuration data defines a second memory configuration.

8. The apparatus of claim 1, wherein the input data is programmed into the second register when a write-enable signal is asserted at an enable input of the second register and when the first reset line is de-asserted.

9. The apparatus of claim 1, wherein the second register is programmed with the default configuration data when the second reset line is asserted and the value of the programmable selection circuit has a logical value of one, and wherein the second register is to the retain previous content when the second reset line is asserted and the value of the programmable selection circuit has a logical value of zero.

10. The apparatus of claim 1, further comprising a first OR gate, wherein the second reset line is coupled to a non-inverted input of the first OR gate and the programmable selection circuit is coupled to an inverted input of the first OR gate, and wherein an output of the first OR gate is used to determine whether the second register is programmed with the default configuration data or the second register is to retain the previous content.

11. The apparatus of claim 10, further comprising an AND gate, wherein the first reset line is coupled to a first input of the AND gate and the output of the first OR gate is coupled to a second input of the AND gate, and wherein an output of the AND gate is used to determine whether the second register is programmed with the default configuration data or the second register is to retain the previous content.

12. The apparatus of claim 11, further comprising:
a second OR gate coupled to the first register and having an output coupled to a set input of the second register; and
a third OR gate coupled to the first register and having an output coupled to a reset input of the second register, the second OR gate setting the second register to a logical value of one and the third OR gate resetting the second register to a logical value of zero.

13. The apparatus of claim 12, wherein the second OR gate comprises an inverted input to receive an output from the first register and a non-inverted input to receive an output from the AND gate.

14. The apparatus of claim 12, wherein the third OR gate comprises a first input to receive an output from the first register and a second input to receive an output from the AND gate.

15. A system, comprising:
a processor;
a memory subsystem coupled to the processor and comprising flash memory, the memory subsystem including:
a first register to store default configuration data;
a second register coupled to the first register to store active configuration data;
an input circuit coupled to the second register to receive input data different than the default configuration data to be programmed into the second register;
control logic coupled to the first register, the second register, and the input circuit to load the second register with data selected between the default configuration data front the first register and input data from the input circuit; and
reset logic coupled to the first register and the second resister to select between loading the second register with the default configuration data and retaining a previous content of the second register in the second register, the rest logic including
a first reset line to carry a first reset signal to load default data from the first resister into the second register,
a second reset line coupled to the programmable selection circuit to carry a second reset signal, and
a programmable selection circuit to store a selection value to determine if the second reset signal causes the second resister to be loaded with the default configuration data from the first resister or causes the second register to retain its data.

16. The system of claim 15, wherein the first reset line is a power-up reset line.

17. The system of claim 15, wherein the second reset line is a warm-start reset line.

18. The system of claim 15, wherein the input circuit is to receive write data from a data bus, the write data comprising programmable configuration data.

19. The system of claim 15, wherein the first register is a non-volatile register.

20. The system of claim 15, wherein the second register is a volatile register.

21. The system of claim 15, wherein the default configuration data defines a first memory configuration and the programmable configuration data defines a second memory configuration.

22. The system of claim 15, wherein the input data is programmed into the second register when a write-enable signal is asserted at an enable input of the second register and when the first reset line is de-asserted.

23. The system of claim 15, wherein the second register is programmed with the default configuration data when the second reset line is asserted and the value of the programmable selection circuit has a logical value of one, and wherein the second register is to the retain previous content when the second reset line is asserted and the value of the programmable selection circuit has a logical value of zero.

24. The system of claim 15, wherein the memory subsystem further comprises a first OR gate, wherein the second reset line is coupled to a non-inverted input of the first OR gate and the programmable selection circuit is coupled to an inverted input of the first OR gate, and wherein an output of the first OR gate is used to determine whether the second register is programmed with the default configuration data or the second register is to retain the previous content.

25. The system of claim 24, wherein the memory subsystem further comprises an AND gate, wherein the first reset line is coupled to a first input of the AND gate and the output of the first OR gate is coupled to a second input of the AND gate, and wherein an output of the AND gate as used to determine whether the second register is programmed with the default configuration data or the second register is to retain the previous content.

26. The system of claim 25, wherein the memory subsystem further comprises:
a second OR gate coupled to the first register and having an output coupled to a set input of the second register; and
a third OR gate coupled to the first register and having an output coupled to a reset input of the second register, the second OR gate setting the second register to a logical value of one and the third OR gate resetting the second register to a logical value of zero.

27. The system of claim 26, wherein the second OR gate comprises an inverted input to receive an output from the first register and a non-inverted input to receive an output from the AND gate.

28. The system of claim 26, wherein the third OR gate comprises a inverted input to receive an output from the first register and a second input to receive an output from the AND gate.

29. A method, comprising:
providing, in a memory device, a first register containing default configuration data;
selecting active configuration data from between the default configuration data in the first register and input data from an input logic circuit, the input logic circuit receiving the input data different than the default configuration data;

writing the active configuration data into a second register;

loading the default configuration data from the first register into the second register upon assertion of a first reset signal;

selecting, upon assertion of a second reset signal, between retaining the active configuration data in the second resister and loading the default configuration data from the first resister into the second register; and using the active configuration data in the second register to specify a configuration.

30. The method of claim 29, wherein providing the first register includes providing a non-volatile register.

31. The method of claim 29, wherein writing into the second register includes writing into a volatile register.

32. The method of claim 29, wherein assertion of a first reset signal includes assertion of a power-up reset signal.

33. The method of claim 29, wherein assertion of a second reset signal includes assertion of a warm-start reset signal.

34. The method of claim 29, wherein selecting active configuration data includes selecting programmable configuration data from the input logic circuit to define an operational configuration of a memory that is different than defined by the default configuration data.

35. The method of claim 34, wherein the second register is programmed with the default configuration data when the second reset signal is asserted and the value of the programmable selection circuit has a logical value of one, and wherein the second register is to the retain previous content when the second reset signal is asserted and the value of the programmable selection circuit has a logical value of zero.

36. The method of claim 34, further comprising:

coupling the second reset signal to a non-inverted input of a first OR gate;

coupling the programmable selection circuit to an inverted input of the first OR gate; and determining whether the second register is programmed with the default configuration data or the second register is to retain the previous content, based on an output of the first OR gate.

37. The method of claim 36, further comprising:

coupling the first reset signal to a first input of an AND gate;

coupling the output of the first OR gate to a second input of the AND gate; and determining whether the second register is programmed with the default configuration data or the second register is to retain the previous content, based on an output of the AND gate.

38. The method of claim 37, further comprising:

coupling a second OR gate to the first register and having an output coupled to a set input of the second register; and coupling a third OR gate to the first register and having an output coupled to a reset input of the second register, the second OR gate setting the second register to a logical value of one and the third OR gate resetting the second register to a logical value of zero.

39. The method of claim 38, wherein the second OR gate comprises an inverted input to receive an output from the first register and a non-inverted input to receive an output from the AND gate.

40. The method of claim 38, the third OR gate comprises a first input to receive an output from the first register and a second input to receive an output from the AND gate.

41. The method of claim 29, wherein selecting active configuration data includes selecting default configuration data to define a predetermined intended operational configuration of a memory.

42. The method of claim 29, wherein the input data is programmed into the second register when a write-enable signal is asserted at an enable input of the second register and when the first reset signal is de-asserted.

* * * * *